(12) United States Patent
Dando, III et al.

(10) Patent No.: US 7,804,179 B2
(45) Date of Patent: Sep. 28, 2010

(54) PLASTIC BALL GRID ARRAY RUGGEDIZATION

(75) Inventors: Charles H. Dando, III, Vestal, NY (US); Stephen G. Gonya, Endicott, NY (US); William E. Murphy, Vestal, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/108,792

(22) Filed: Apr. 24, 2008

(65) Prior Publication Data

US 2009/0267227 A1  Oct. 29, 2009

(51) Int. Cl.
*H01L 21/00* (2006.01)
(52) U.S. Cl. ............................. 257/779; 257/E21.499
(58) Field of Classification Search ................ 257/779, 257/E23.069, E21.499; 438/107
See application file for complete search history.

(56) References Cited

U.S. PATENT DOCUMENTS

| 5,635,767 | A | * | 6/1997 | Wenzel et al. ............... 257/778 |
| 5,843,808 | A |  | 12/1998 | Karnezos |
| 5,972,738 | A |  | 10/1999 | Vongfuangfoo et al. |
| 6,020,221 | A |  | 2/2000 | Lim et al. |
| 6,288,900 | B1 |  | 9/2001 | Johnson et al. |
| 6,410,988 | B1 |  | 6/2002 | Caletka et al. |
| 6,475,327 | B2 |  | 11/2002 | Tung et al. |
| 6,501,171 | B2 |  | 12/2002 | Farquhar et al. |
| 6,583,515 | B1 | * | 6/2003 | James et al. ............... 257/779 |
| 6,639,304 | B1 |  | 10/2003 | Oggioni et al. |
| 6,829,149 | B1 |  | 12/2004 | Chang et al. |
| 2006/0065972 | A1 | * | 3/2006 | Khan et al. ............... 257/712 |
| 2007/0045824 | A1 | * | 3/2007 | Zhao et al. ............... 257/706 |

* cited by examiner

*Primary Examiner*—Trung Dang
(74) *Attorney, Agent, or Firm*—Burns & Levinson LLP; Harvey Kaye

(57) ABSTRACT

A method and product which provides a thin metal or ceramic plate to the top of a plastic grid array (PGA) as a stiffener to maintain its flatness over temperature during a column attach process, and the columns are used for attachment to circuit boards or other circuit devices. These may be constructed in this manner initially or may be retrofitted plastic ball grid arrays from which the solder balls are removed and, the stiffener is attached to the top, and the solder columns have been added to replace the solder balls. The stiffener is a bonded thin metal or ceramic plate attached to the top of the PGA to maintain its flatness over temperature during the column attach process. An aluminum plate bonded to the top of a PGA results in a significant reduction in warping during a temperature cycle. This allows attachment of solder columns to the PBGA. The high melt solder columns are attached to an area array pattern on the PBGA substrate. This array is typically either a solid or perimeter grid. It is critical that the ends of the solder columns opposite the ends attached to the substrate align precisely with the matching grid of solder pads on the printed wiring board. The purpose of the stiffening plate is to maintain the flatness of the PBGA during the process of attaching the columns to the substrate as well as attaching the component to the printed wiring board such that the columns maintain their alignment over this temperature range.

5 Claims, 4 Drawing Sheets

PLASTIC BALL GRID ARRAY RUGGEDIZATION

FIELD OF THE INVENTION

This invention relates generally to electronic packaging assemblies, and more particularly, to grid array packages that are surface mounted on printed wiring boards.

BACKGROUND OF THE INVENTION

U.S. Pat. No. 5,972,738 is for a PBGA Stiffener Package which includes a stiffener ring and a stiffener fixture. The stiffener ring and PBGA member are essentially coplanar to less than 8 mils and a top plate is placed on top of the PBGA member and the ring and member are secured together tightly.

U.S. Pat. No. 6,475,327 for attachment of a stiff heat spreader for fabricating a cavity down plastic chip carrier where there is a stiff heat spreader element and first and second bonding sheets are used and the second sheet is used to bond a circuit substrate and the stiff heat spreader element.

U.S. Pat. No. 6,020,221 is for a process for manufacturing a semiconductor device having a stiffener member which is attachable to the substrate.

U.S. Pat. No. 6,410,988 is for a thermally enhanced and mechanically balanced flip chip package and method of forming where a thermally conductive member is used in an attempt to maintain flatness over a wide temperature range.

U.S. Pat. No. 6,288,900 is for a warpage compensating heat spreader where a cap is provided for a stiffness characteristic that differs as it extends into different regions of the module.

U.S. Pat. No. 5,843,808 is for a structure and method for automated assembly of a tab grid array package where a metal strip stiffener is used in the production of a PBGA package assembly.

U.S. Pat. No. 6,501,171 is for a flip chip package with improved cap design and process for making same where a heat spreading perforated cap is used with adhesive fills the perforations to prevent delamination or warpage.

U.S. Pat. No. 6,639,304 is for a ball grid array module where a metal stiffener is used to provide lateral shielding for the HF applications.

U.S. Pat. No. 6,829,149 is for placement of sacrificial solder balls underneath the PBGA substrate where the layers of the laminate are arranged according to the stiffness of each layer.

U.S. Pat. Nos. 6,214,650 and 6,459,164 are for sealing a ball grid array package and circuit card interconnection where a BGA is surface mounted to a printed wiring board using solder balls and tubing is placed along the perimeter of the BFGA housing to prevent subsequently applied sealant from contacting the solder balls.

Many plastic ball grid arrays (PBGAs) have a coefficient of thermal expansion (CTE) that results in high levels of solder joint strain resulting in premature failure in DoD field environments. The CTE of the PBGA maybe significantly different from that of the printed wiring board to which it is soldered. One technique of improving solder joint reliability for ceramic ball grid arrays has been to replace the solder balls with high melt solder columns. This has not been accomplished with PBGAs. One potential reason is the warpage of the PBGA substrate during the column attach process or the assembly process, both of which affects the alignment of the columns.

Other techniques attempted include underfill (reworkability issues and limited success) and low expansion PWBs (Global solution). The later solution may cause issues with other high expansion components, add cost and other manufacturing difficulties.

SUMMARY OF THE PRESENT INVENTION

The solder joint reliability of PBGA components may be increased by replacing its solder balls with high melt solder columns. In addition, prior to adding the columns, a stiffener is bonded to the top of the component to maintain flatness over the temperature ranges associated with both the solder column attach and assembly soldering processes. The invention replaces solder balls with columns, which may be high melt solder, copper wire, or others, to increase strain relief between component and printed wiring board.

The present invention attaches a thin metal or ceramic plate to the top of a plastic grid arrays (PGA) as a stiffener to maintain its flatness over temperature during a solder column attach process. The columns are used instead of solder balls for interconnection to circuit boards or other circuit devices.

The plastic column grid array may be constructed in this manner initially or may be retrofitted.

The stiffener is a thin metal or ceramic plate (or it can be a frame type or other type having a planar surface with a lip around the edge that mates with the columns) which is bonded to the top of the PBGA to maintain its flatness over temperature during the column attach process. It has been found using moire interferrometry that bonding an aluminum plate to the top of a PBGA can result in a significant reduction in warping during temperature cycling. This allows attachment of solder columns to the PBGA without a misalignment of the columns. This combination of a stiffener and high melt solder columns increases the solder joint reliability of the PBGA.

In the retrofitting process, the solder balls are replaced with columns (high melt solder, copper wire, or others) to increase strain relief between components and printed wiring boards.

The solder columns provide for increased solder joint reliability and ability to reliably utilize specific PBGA components that otherwise could not be used in harsh environments.

The present invention together with the above and other advantages may best be understood from the following detailed description of the embodiments of the invention illustrated in the drawings, wherein:

DETAILED DESCRIPTION OF PREFERRED EMBODIMENTS

The present invention provides a thin metal or ceramic plate which is attached to the top of a plastic grid arrays (PBGA) as a stiffener to maintain the PBGA's flatness over a temperature range during a column attach process so that the array of columns attached to the PBGA maintain alignment for future attachment on the printed wiring board surface.

Figure 1:
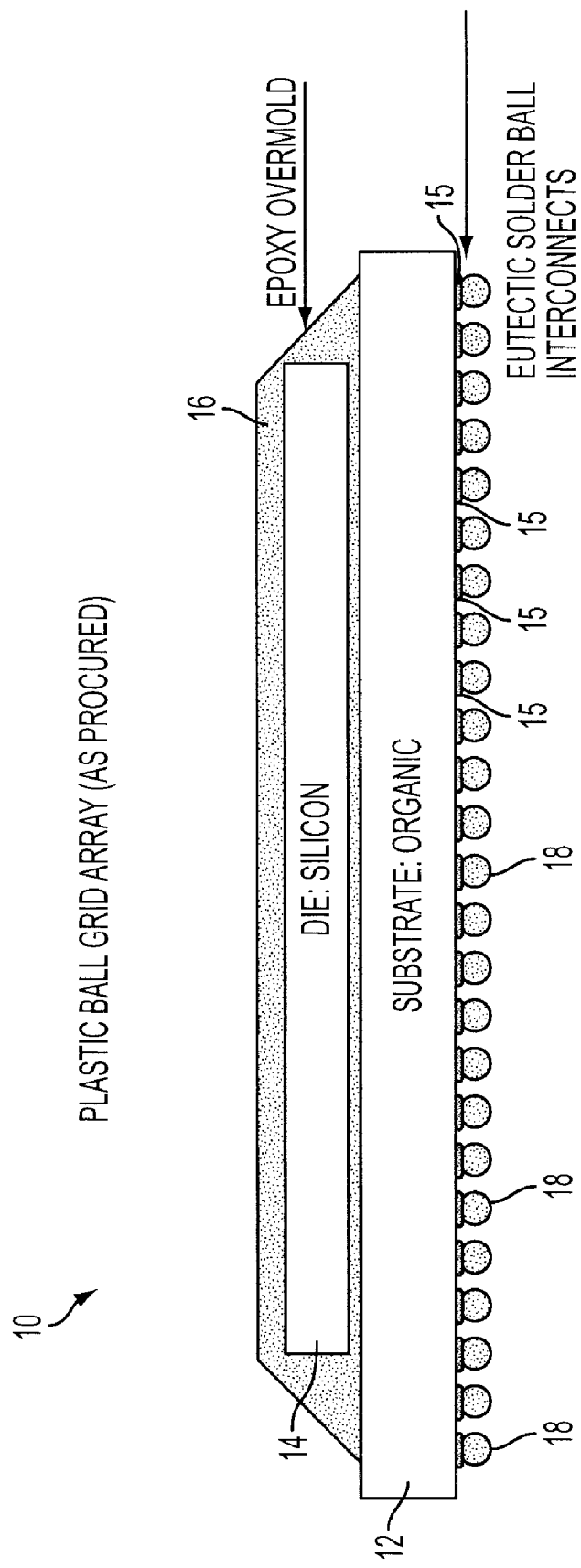
FIG. 1 is a schematic sectional view of a ball grid array assembly.

FIG. 1 is a plastic ball grid array 10 as procured which, in this example, includes an organic substrate 12, a silicon die 14, an epoxy overmold 16 and SnPb or Pb free solder ball interconnects 18 along the bottom. The die is attached to the substrate with either wire bonds or C4 interconnects. The PBGA comes from the supplier with SnPb or Pb free solder balls. In cases where the mismatch of thermal expansions between the PBGA and printed wiring board are excessive, it would be desirable for the user to add columns to provide additional strain relief, but due to warping of the PBGA when exposed to high temperatures, this cannot be done. The present invention provides a manner of attaching columns without the problems associated with warping which would not allow assembly to the circuit card assembly. There are metalized pads 15 between the substrate and the solder ball interconnects as shown.

Figure 2:
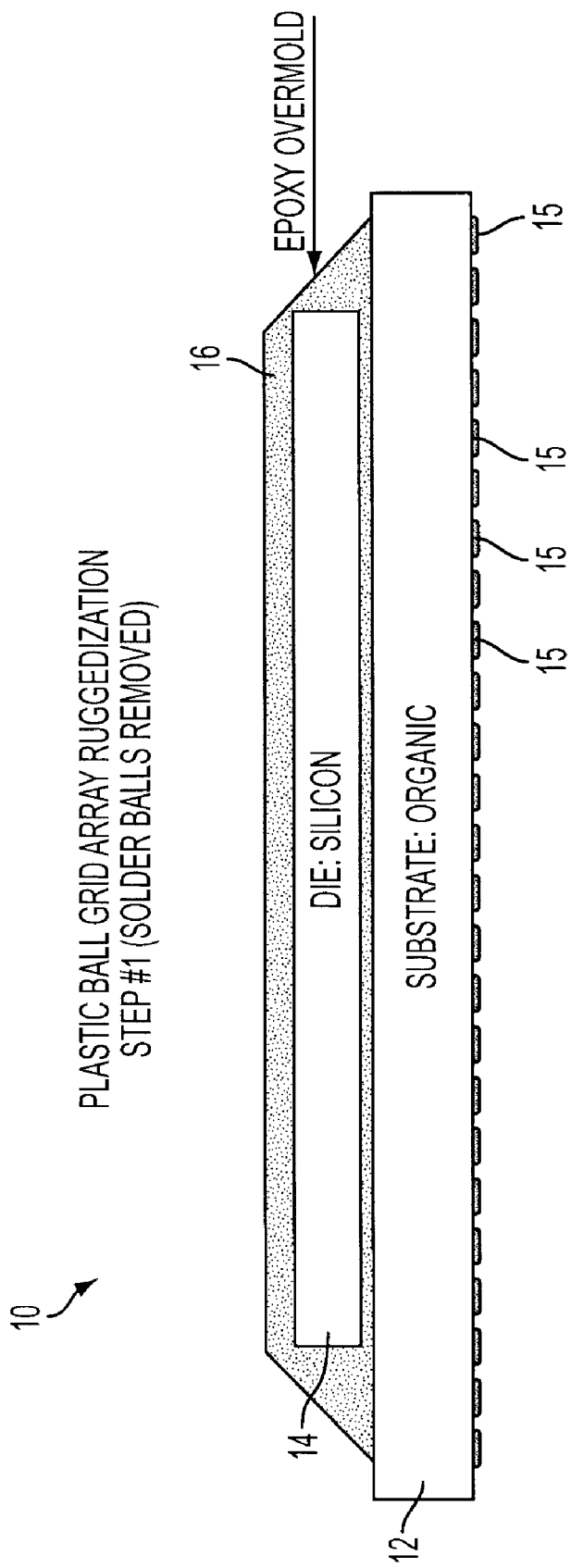
FIG. 2 is a schematic sectional view of a ball grid array assembly after the solder balls have been removed.

FIG. 2 shows the next step in which the solder ball interconnects 18 have been removed. This leaves the metallized pads 15 on the bottom side of the organic substrate 12.

Figure 3:
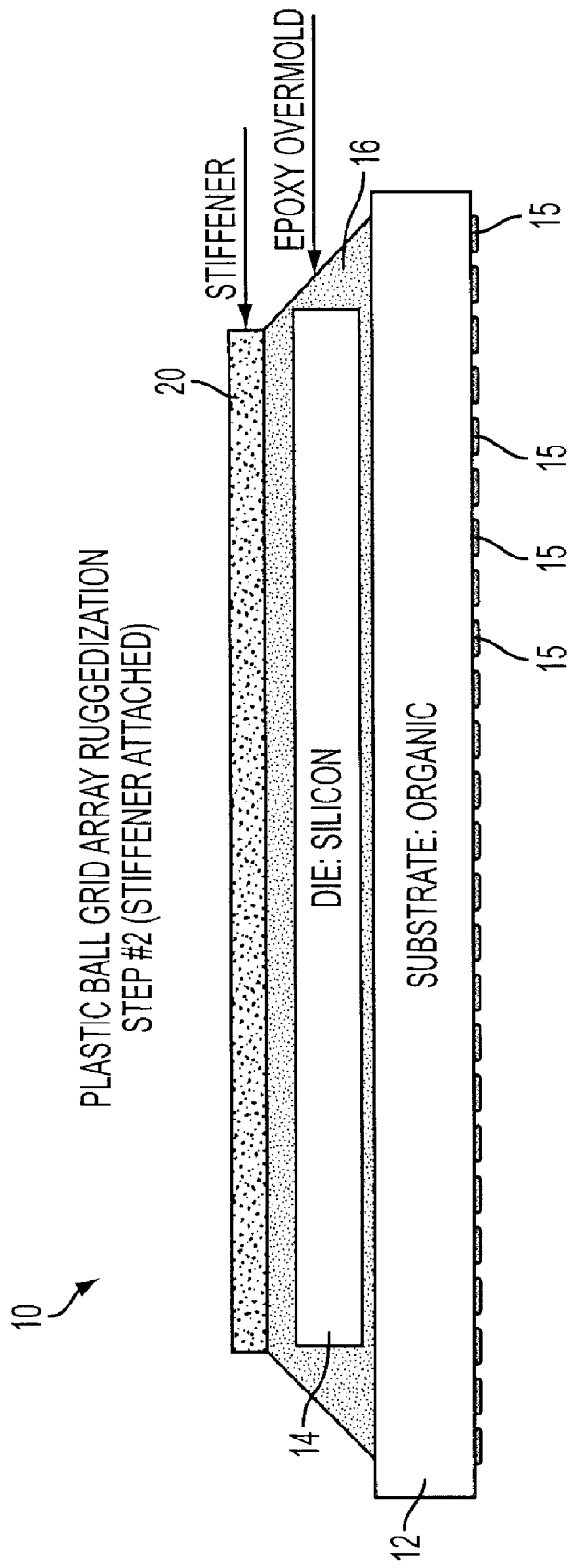
FIG. 3 is a schematic sectional view of the assembly similar to FIG. 2 but in which a stiffener has been added.

FIG. 3 shows the stiffener 20 added to the top. The stiffener 20 is bonded to the top of the component to prevent warping. Without the stiffener, the part would warp during the process of attaching the high melt solder columns. The stiffener 20 ensures the component can be processed through the column attach process without warping during the heating or cooling process. This also prevents warpage during subsequent assembly processing. The stiffener can be a planar plate, or a frame, or in another form which has a planar surface. The planar surface may have a lip around the edge that mates with the columns.

Figure 4:
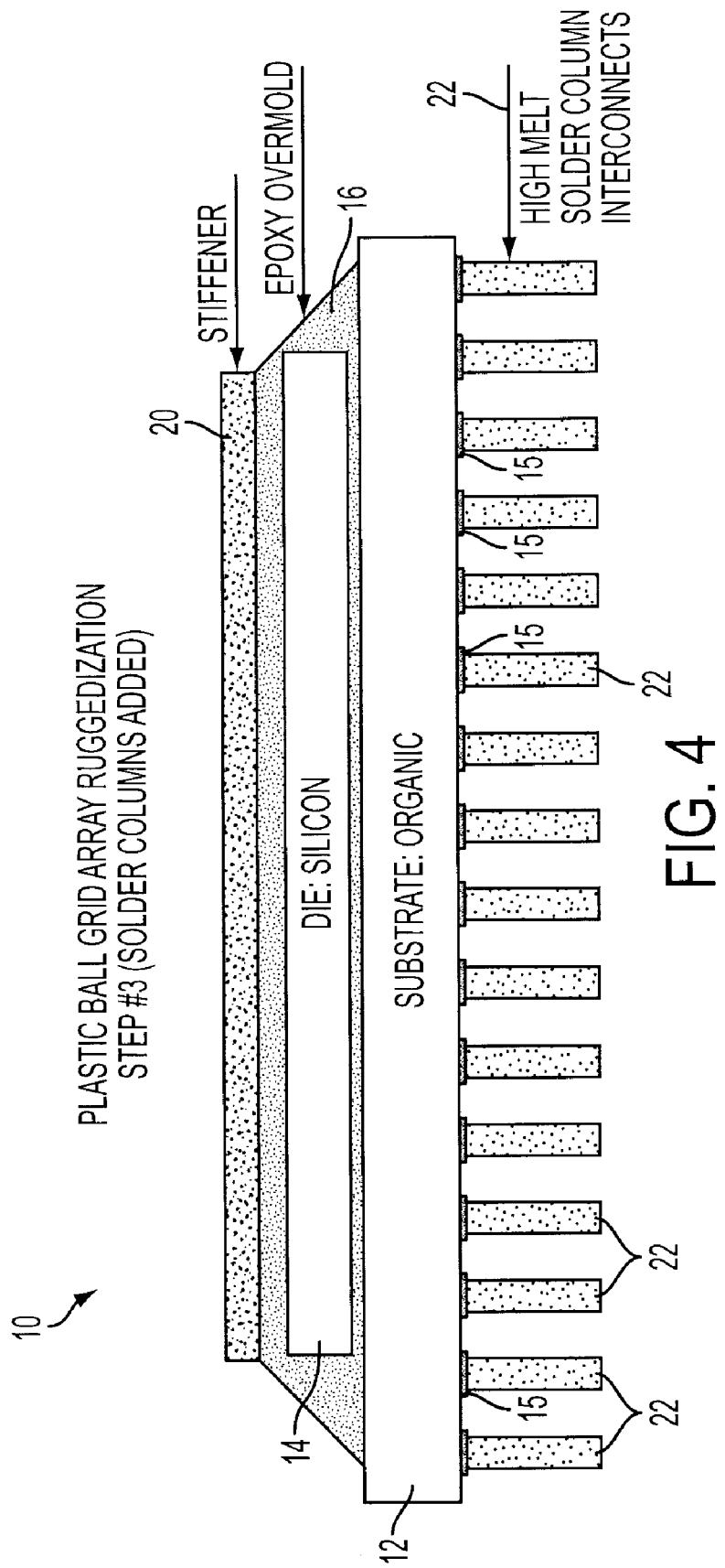
FIG. 4 is a schematic isometric view of the present invention showing the column interconnects attached to the substrate.

FIG. 4 shows the high melt solder column interconnects 22 added to the bottom of the substrate 12. The final step of the process is to solder the high melt solder columns 22 to the substrate's metalized pads 15 with SnPb or Pb free solder. This is accomplished by screening solder paste to the metalized pads and then locating the high melt columns via a holding fixture, and then attaching them to the substrate using a convection oven. This is then the final component ready to assembly to the circuit card assembly. At this point, the stiffener functions to maintain flatness during the assembly solder reflow process. This is critical in maintaining the alignment of the solder columns with the attach pattern on the printed wiring board.

As noted, instead of being retrofit, the plastic grid array could be constructed initially with the column interconnects and the stiffener. Also, the various components may take various forms within the skill of the art and are not to be considered limited to the particular description provided in the present description.

It is to be understood that the above-described embodiments are simply illustrative of the principles of the invention. Various and other modifications and changes may be made by those skilled in the art which will embody the principles of the invention and fall within the spirit and scope thereof.

The invention claimed is:

1. A method of retrofitting a plastic ball grid array, comprising the steps of:
 a. providing a plastic ball grid array having solder balls on a surface of a substrate;
 b. removing the solder balls from the substrate;
 c. adding a stiffener; and
 d. attaching high melt solder column interconnects to the substrate in place of the solder balls.

2. The method of claim 1 wherein the columns are high melt solder, the columns are of a material which increases strain relief between the components and the printed wiring board.

3. The method of claim 1 wherein the columns are of a material which increases strain relief between the components and the printed wiring board.

4. The method of claim 1 wherein the stiffener is bonded to the top of the array to maintain flatness over a temperature range.

5. The method of claim 1 wherein there are metalized pads between the substrate and the columns.

* * * * *

UNITED STATES PATENT AND TRADEMARK OFFICE
CERTIFICATE OF CORRECTION

PATENT NO. : 7,804,179 B2  Page 1 of 1
APPLICATION NO. : 12/108792
DATED : September 28, 2010
INVENTOR(S) : Charles H. Dando, III et al.

It is certified that error appears in the above-identified patent and that said Letters Patent is hereby corrected as shown below:

In column 4, line 29 (claim 3), "The method of claim 1" should read -- The method of claim 2 --

In column 4, line 32 (claim 4), "The method of claim 1" should read -- The method of claim 3 --

Signed and Sealed this

Thirtieth Day of November, 2010

David J. Kappos
*Director of the United States Patent and Trademark Office*